(12) United States Patent
Syri et al.

(10) Patent No.: US 7,825,506 B2
(45) Date of Patent: Nov. 2, 2010

(54) SEMICONDUCTOR MODULE INCLUDING SEMICONDUCTOR CHIPS IN A PLASTIC HOUSING IN SEPARATE REGIONS

(75) Inventors: Erich Syri, Wenzenbach (DE); Gerold Gruendler, Regensburg (DE); Juergen Hoegerl, Regensburg (DE); Thomas Killer, Hohenschambach (DE); Volker Strutz, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 369 days.

(21) Appl. No.: 11/910,113

(22) PCT Filed: Mar. 27, 2006

(86) PCT No.: PCT/DE2006/000543

§ 371 (c)(1),
(2), (4) Date: May 23, 2008

(87) PCT Pub. No.: WO2006/102874

PCT Pub. Date: Oct. 5, 2006

(65) Prior Publication Data

US 2009/0057874 A1    Mar. 5, 2009

(30) Foreign Application Priority Data

Mar. 29, 2005   (DE) .................. 10 2005 014 674

(51) Int. Cl.
*H01L 23/02* (2006.01)

(52) U.S. Cl. .............. 257/701; 257/E23.18; 257/E21.5; 438/125

(58) Field of Classification Search .................. 257/701, 257/E23.18, E21.5; 438/125
See application file for complete search history.

(56) References Cited

U.S. PATENT DOCUMENTS

| 5,466,969 A | 11/1995 | Tsunoda |
| 5,777,847 A * | 7/1998 | Tokuno et al. .............. 361/705 |
| 2001/0052639 A1 | 12/2001 | Jeon et al. |
| 2002/0195699 A1 | 12/2002 | Akram et al. |
| 2003/0025187 A1 | 2/2003 | Strutz et al. |
| 2003/0025194 A1 | 2/2003 | Gebauer et al. |

FOREIGN PATENT DOCUMENTS

| DE | 3930858 | 3/1990 |
| DE | 10146854 | 4/2003 |
| EP | 0774782 | 5/1997 |
| EP | 1524690 | 4/2005 |
| JP | 2003298009 | 10/2003 |

* cited by examiner

*Primary Examiner*—Evan Pert
*Assistant Examiner*—Krista Soderholm
(74) *Attorney, Agent, or Firm*—Dicke, Billig & Czaja, PLLC

(57) ABSTRACT

A semiconductor module and a method for producing the same is disclosed. In one embodiment, the semiconductor module has adjacent regions on a common wiring substrate in a common plastic housing composition. The regions are thermally decoupled by a thermal barrier. Semiconductor chips whose evolution of heat loss differs are arranged in these thermally separate regions, the thermal barrier ensuring that the function of the more thermally sensitive semiconductor chip is not impaired by the heat-loss-generating semiconductor chip.

22 Claims, 3 Drawing Sheets

SEMICONDUCTOR MODULE INCLUDING SEMICONDUCTOR CHIPS IN A PLASTIC HOUSING IN SEPARATE REGIONS

CROSS-REFERENCE TO RELATED APPLICATIONS

This National Phase Utility Patent Application claims priority to PCT Application No. PCT/DE2006/000543, filed Mar. 27, 2006, which claims priority from German Patent Application DE 10 2005 014 674.0, filed Mar. 29, 2005, both of which are herein incorporated by reference.

BACKGROUND

The invention relates to a semiconductor module including semiconductor chips in a plastic housing in separate regions, and to a method for producing the same.

In order to produce multichip semiconductor modules, thermally sensitive semiconductor chips together with thermally more robust semiconductor chips are often enclosed in a common plastic housing composition.

For thermal reasons, however, it would be expedient to accommodate these semiconductor chips in separate housings and therefore to mount them in dedicated housings. The separate construction of individual housings has the disadvantage, however, that a rapid and interference-free data exchange between the individual semiconductor chips is impeded by the mounting of the separate housings on a superordinate printed circuit board. Therefore, despite the thermal coupling, mounting in common plastic housings of a multichip package may be preferred. For the heat transfer from one semiconductor chip to the adjacent semiconductor chip, it is relatively unimportant whether the semiconductor chips are accommodated in the multichip housing of the semiconductor module using flip-chip technology or are electrically coupled to one another with the aid of bonding technology. The problem of the thermal coupling and the heating of a thermally sensitive semiconductor chip by an adjacent semiconductor chip having a high heat loss still remains.

In this case, the heat conduction through the common plastic housing composition is one of the most important thermal paths on which the mutual adverse thermal influencing of the semiconductor chips of the semiconductor module is based. Semiconductor modules which accommodate individual semiconductor chips in separate plastic housing compositions but have a common wiring substrate also likewise have the disadvantage of impeding a rapid and low-interference communication between the individual semiconductor chips. Moreover, the connecting lines on the common substrate are not mechanically protected perfectly in the way that is possible with a common plastic housing composition.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

Figure 1:
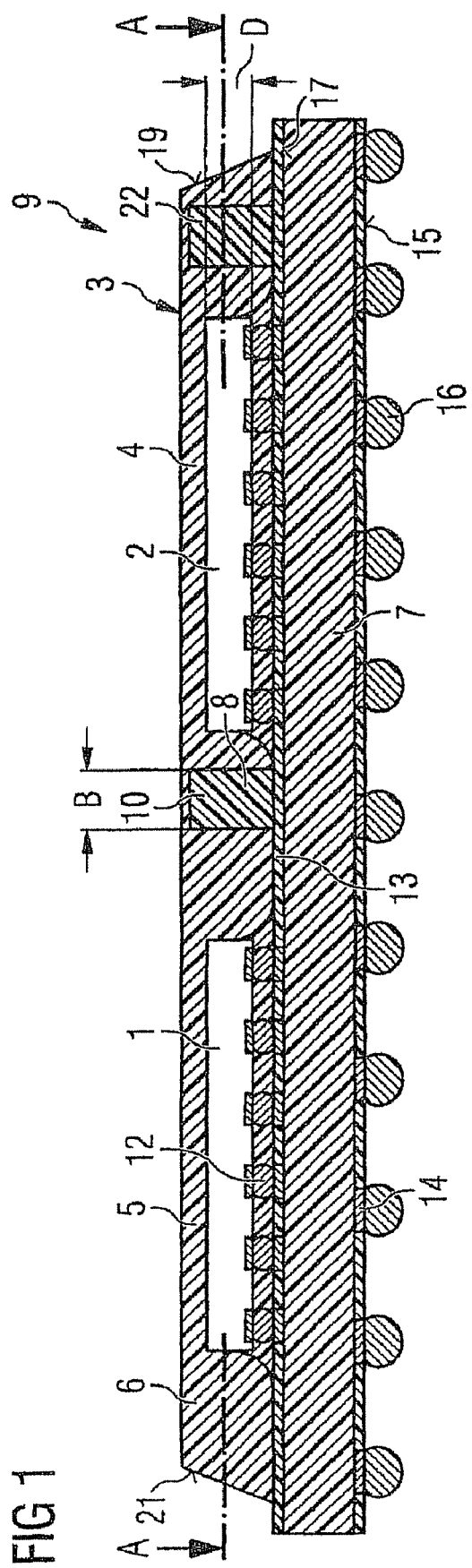
FIG. 1 illustrates a schematic cross section through a semiconductor module of a first embodiment of the invention.

It is an embodiment of the invention to overcome the disadvantages in the prior art and to provide a semiconductor module in which the thermal coupling in a common plastic housing composition between two separately arranged semiconductor chips is reduced.

The invention provides a semiconductor module including semiconductor chips, in a plastic housing in separate regions, wherein the semiconductor chips are embedded in a common plastic housing composition and are arranged on a common wiring substrate in adjacent regions. The wiring substrate has a thermal barrier between the regions, which thermal barrier impedes the heat transfer from one region to an adjacent region. In this case, the thermal barrier, the semiconductor chips and the substrate are surrounded by the common plastic housing composition.

This semiconductor module has one advantage that the heat conduction path via the common plastic composition is interrupted by the thermal barrier, such that thermally sensitive semiconductor chips, such as e.g., dynamic memories, the recovery time of which would be impaired at high temperature, are now protected from a semiconductor chip, e.g., a processor, having a significantly higher evolution of heat loss. For a semiconductor module equipped with a thermal barrier as claimed in the invention, this affords the possibility of the recovery time of a dynamic memory not being impaired despite a high heat loss e.g., of a processor, such that the memories can be utilized with a correspondingly high data transfer rate.

In one embodiment, the material of the thermal barrier has a specific heat conduction $W_B$ of less than ⅓ of the specific heat conduction $W_K$ of the common plastic housing composition where $W_K \geq 3 W_B$. This difference in the specific heat conduction has the effect of ensuring a considerable decoupling between the two regions of the semiconductor module for the semiconductor chips arranged in the corresponding regions. In order to position the thermal barrier stably and effectively on the wiring substrate, the thermal barrier has a width B that is at least five times the thickness D of the semiconductor chips where $B \geq 5D$.

The thermal barrier can be formed in various ways. It can first of all thermally shield a region to be protected from an adjacent region just on one side or else surround the region to be protected on two sides. Furthermore, there are possibilities available, depending on the size of the substrate, for surrounding the region to be protected on three sides or providing it with a thermal barrier completely on all four sides.

A thermal barrier of this type can have a prefabricated thermal barrier element which is prepositioned in the injection mold during the injection-molding of the plastic housing composition. On the other hand, the prefabricated thermal barrier element can also be adhesively bonded onto the top side of the substrate before the plastic housing composition is applied onto the substrate. Secure positioning of the thermal barrier element is possible in both cases. The thermal barrier element itself can be composed of a plastic material with a filler material different from the plastic housing composition.

The different filler material makes it possible to achieve the abovementioned difference in thermal conductivity. Other thermal barrier materials have ceramic prefabricated thermal barrier elements, which, given correspondingly high polycrystalline structuring, have a correspondingly lower heat conduction in comparison with the heat-conducting plastic. In principle, it is possible both to arrange the thermal barrier around the region of a heat-loss-generating semiconductor chip and to construct it around the region of a thermally sensitive semiconductor chip. However, the thermal barrier is moved into the vicinity of the thermally sensitive semiconductor chip in order not to impede the heat loss emission of the heat-loss-generating semiconductor chip via the plastic housing composition of the semiconductor module and in order only to prevent the introduction of heat into the region of the thermally sensitive semiconductor chip.

A method for producing a semiconductor module, including semiconductor chips in a plastic housing in separate regions, has the following method processes. The first process involves producing semiconductor chips which are characterized by different thermal sensitivities and are provided for a semiconductor module. This is followed by applying a thermal barrier between adjacent regions which are to be thermally decoupled onto a wiring substrate.

The semiconductor chips are subsequently accommodated onto the common wiring substrate, but in distributed fashion, in the thermally decoupled regions. Finally, the device components, namely the semiconductor chips, the wiring substrate and the thermal barrier, are packaged into a common plastic housing composition while embedding the thermal barrier. This method has the advantage that externally it cannot be seen from the semiconductor module whether a thermal barrier is integrated into the plastic housing. Consequently, a semiconductor device of this type can be packaged into a plastic housing composition with the aid of known injection-molding technology without changing the standardized housing types.

An alternative to this method provides for preparing a thermal barrier element and positioning and fixing it in an injection mold. Finally, when packaging the components in a plastic housing composition, the thermal barrier element prepositioned in the injection mold is arranged on the substrate. The fixing of a thermal barrier of this type in an injection mold can be effected in force-locking fashion, such that a fixing consists in the thermal barrier element being pressed into the injection mold.

When applying the thermal barrier element onto the substrate, there is the risk of the high injection-molding pressure causing the thermal element to shift on the substrate. Therefore, in a further embodiment of the method, it is provided that the thermal barrier has passage openings in order to ensure a uniform distribution of the plastic housing composition during injection-molding. This is employed particularly when the thermal barrier, or the thermal barrier element, completely surrounds the thermally sensitive semiconductor chip, such that through the openings in the thermal barrier element it is possible for the region surrounded by the thermal barrier to be completely filled with plastic housing composition without the position of the thermal barrier element being shifted.

To summarize, it can be established that the solution as claimed in the invention makes it possible to incorporate semiconductor chips whose evolution of heat loss differs in a common plastic housing composition within a semiconductor module. In this case, the thermal barrier has a plastic material having a significantly lower thermal conductivity than the plastic housing composition. In this case, the thermal barrier element can surround the semiconductor chip which is to be thermally insulated in ring-shaped fashion.

For the efficacy of the thermal barrier it is not critical, however, whether the IC having the highest evolution of heat loss or the IC having the lower evolution of heat loss is enclosed by the thermal barrier. For the thermal management it is advantageous, however, for the semiconductor chip having the lower evolution of heat loss to be surrounded by the thermal barrier. The thermal barrier preferably has a smaller height than the plastic housing composition, such that both the semiconductor chips and the thermal barrier are enclosed by the plastic housing composition on three sides.

FIG. 1 illustrates a schematic cross section through a semiconductor module 9 of a first embodiment. The semiconductor module 9 has two semiconductor chips 1 and 2, which are embedded in a common plastic housing composition 6. The semiconductor chips 1 and 2 are arranged on a wiring substrate 7 and electrically connected to a wiring structure 13 of the wiring substrate 7 by using flip-chip contacts 12. The wiring structure 13 is connected to external contact areas 14 of the semiconductor module 9 on the underside 15 of the wiring substrate 7 by using through contacts (not shown) through the wiring substrate 7, the external contact areas 14 carrying external contacts 16 in the form of solder balls.

In this embodiment, the semiconductor module 9 has two regions 4 and 5, wherein one region 4 thermally decouples the thermally sensitive semiconductor chip 2, which is a dynamic memory in this case, by using a thermal barrier 8 from the region 5 containing the semiconductor chip 1, which is a microprocessor having a high evolution of heat loss in this embodiment. The thermal barrier 8 completely surrounds the semiconductor chip 2, wherein, in this embodiment of the invention, the thermal barrier 8 has a typical thermal conductivity of 0.2 W/mK and the plastic housing composition 6 has a thermal conductivity of 0.7 W/mK. In this embodiment of the invention, the width B of the thermal barrier 8 is 6 mm, while the thickness D of the semiconductor chips 1 and 2 is just 0.55 mm.

The distance between the two adjacent semiconductor chips 1 and 2 is approximately 10 mm. A rough calculation reveals that the thermal resistance is increased by a factor of 1.8 by the thermal barrier 8 in comparison with a semiconductor module not provided with a thermal barrier 8. Consequently, the heat transfer between the individual semiconductor chips in this multichip semiconductor module is curbed by the thermal barrier made of plastic, wherein the plastic body of the thermal barrier 8 is completely embedded into the plastic housing composition 6 and, consequently, this semiconductor module cannot be differentiated externally from conventional semiconductor modules. The size of the thermal barrier becomes visible only from an X-ray photograph or from a cross section through the semiconductor module.

Figure 2:
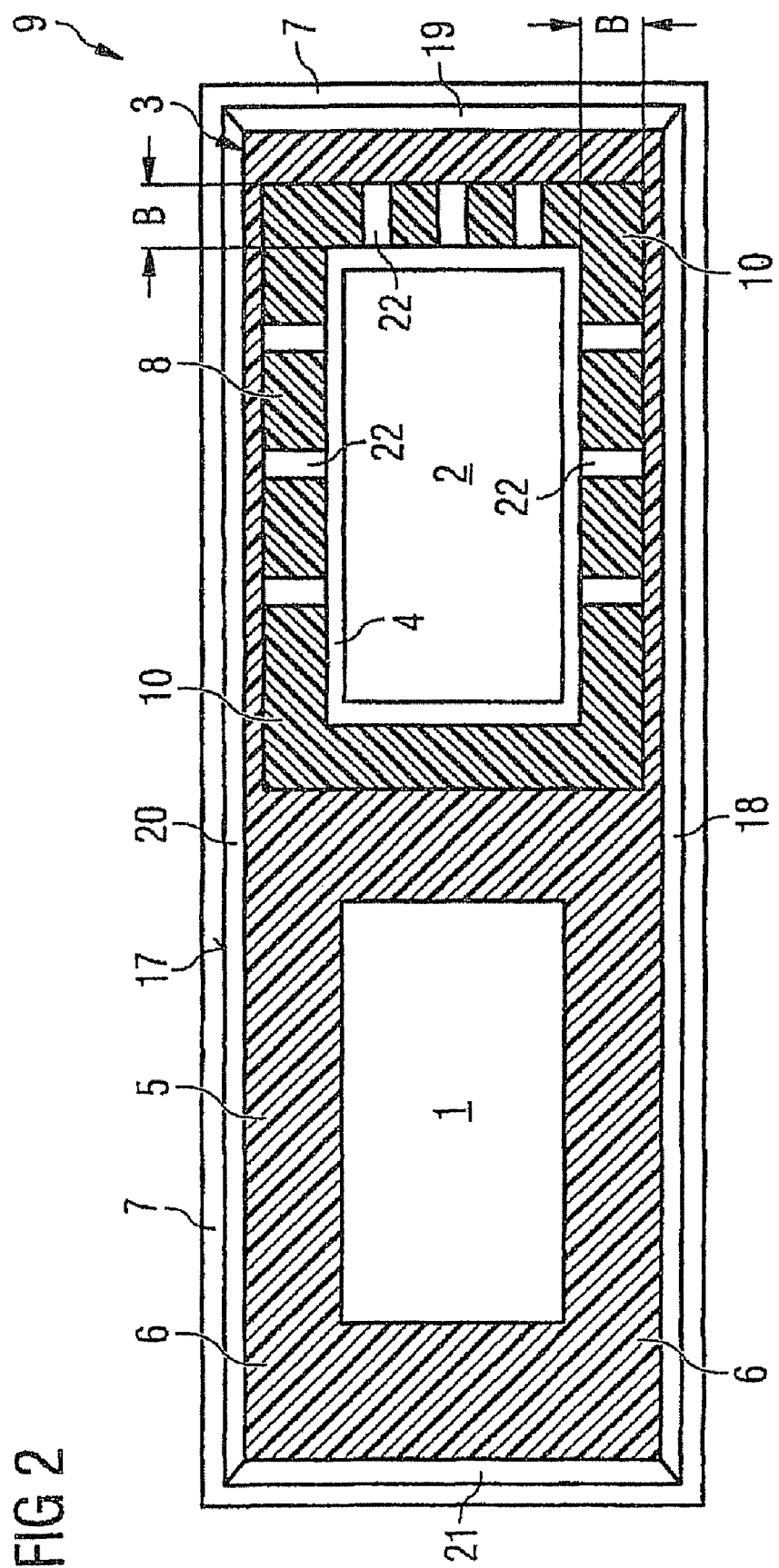
FIG. 2 illustrates a section view through the semiconductor module in accordance with FIG. 1 along the sectional plane A-A.

FIG. 2 illustrates a sectional view through the semiconductor module 9 in accordance with FIG. 1 along the sectional plane A-A. In this embodiment of the invention, the areal extent of the semiconductor chips 1 and 2 is identical in magnitude, the thermally sensitive semiconductor chip 2 being arranged in a region 4 completely surrounded by a thermal barrier 8. The thermal barrier 8 was adhesively bonded onto the top side 17 of the wiring substrate 7 in the form of a thermal barrier element 10 prior to the application of the plastic housing composition 6. The semiconductor chips 1 and 2 are connected to the wiring structure 14 on the top side 17 of the wiring substrate 7 by using flip-chip contacts, which cannot be seen in this sectional plane. The plastic housing 3 has a plastic housing composition 6, the areal extent of which is smaller than the areal extent of the top side 17 of the wiring substrate 7. Moreover, the plastic housing 3 is formed such that it is slightly inclined relative to the sectional plane in its edge sides 18, 19, 20 and 21.

The thermal barrier element 10 has in the section plane openings 22 which are arranged in the lateral regions of the thermal barrier 8 which are not arranged adjacent to the heat-loss-generating semiconductor chip 1. The openings 22 ensure that, during the introduction of the plastic housing composition 6, the region 4 surrounded by the thermal barrier 8 is completely filled with plastic housing composition 6.

Figure 3:
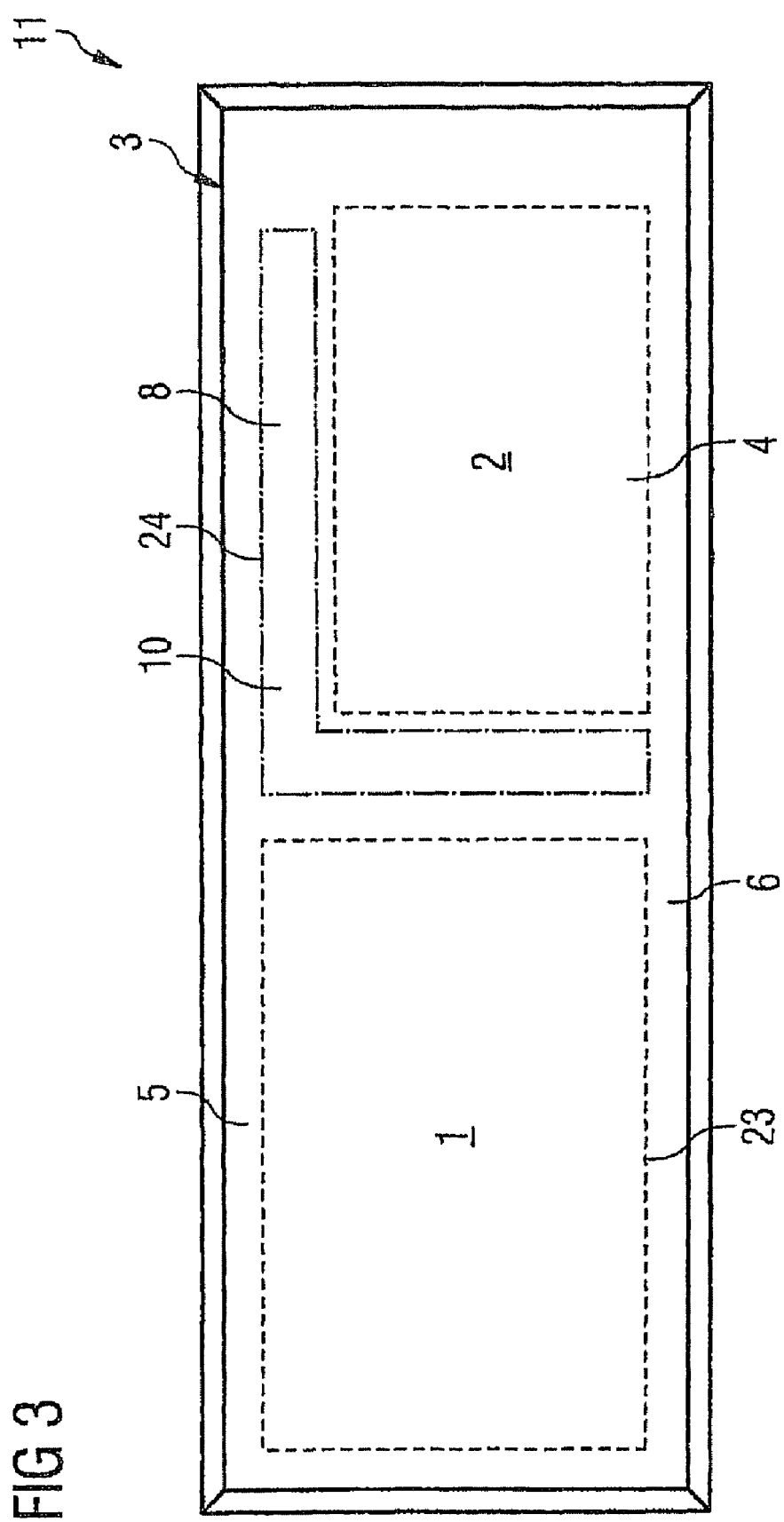
FIG. 3 illustrates a plan view of a semiconductor module of a second embodiment of the invention.

FIG. 3 illustrates a plan view of a semiconductor module 11 of a second embodiment. Components having the same functions as in the previous figures are identified by the same reference symbols and are not discussed separately. The difference between the second embodiment in accordance with FIG. 3 and the embodiment in accordance with FIG. 1 is that the semiconductor chips 1 and 2 have a different areal extent, wherein the heat-generating chip 1, the contour of which is identified by a dashed line 23, takes up a larger area than the thermally sensitive semiconductor chip 2, which is surrounded on two sides by a thermal barrier element 10, the contour of which is marked by a dash-dotted line 24. In this case, no openings are provided in the thermal barrier 8 since no obstacle is present on two sides of the semiconductor chip 2, such that the plastic housing composition 6 can completely embed the semiconductor chip 2 and the thermal barrier 8 during injection-molding.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module comprising;
   semiconductor chips in a plastic housing in separate regions;
   wherein the semiconductor chips are embedded in a common plastic housing composition and are arranged on a common wiring substrate in adjacent regions; and
   wherein the wiring substrate has a thermal barrier between the regions, which thermal barrier impedes the heat transfer from one region to an adjacent region, and wherein the thermal barrier, the semiconductor chips and the substrate are surrounded by the common plastic housing composition.

2. The semiconductor module of claim 1, wherein the semiconductor chips are defined by different evolution of heat loss.

3. The semiconductor module of claim 1, wherein the thermal barrier has a material whose specific heat conduction $W_B$ amounts to less than one third of the specific heat conduction $W_K$ of the common plastic housing composition where $W_K \geq 3 W_B$.

4. The semiconductor module of claim 1, wherein the width B of the thermal barrier amounts to at least five times the thickness D of the semiconductor chips where $B \geq 5D$.

5. The semiconductor module of claim 1, wherein the thermal barrier thermally shields a region to be protected from an adjacent region on one side.

6. The semiconductor module of claim 1, wherein the thermal barrier surrounds a region to be protected on two sides.

7. The semiconductor module of claim 1, wherein the thermal barrier surrounds a region to be protected on three sides.

8. The semiconductor module of claim 1, wherein the thermal barrier completely surrounds a region to be protected.

9. The semiconductor module of claim 1, wherein the thermal barrier has a sintering-ceramic prefabricated element fixed on the wiring substrate.

10. The semiconductor module of claim 1, wherein the thermal barrier has a prefabricated element which is prefixed in position in the injection mold during the injection-molding of the plastic housing composition.

11. The semiconductor module of claim 1, wherein the thermal barrier has a plastic material with a filler material different from the plastic housing composition.

12. The semiconductor module of claim 1, wherein the thermal barrier surrounds a region in which is arranged at least one semiconductor chip having a higher thermal sensitivity compared with an adjacent semiconductor chip.

13. The semiconductor module of claim 1, wherein the thermal barrier surrounds a region in which is arranged at least one semiconductor chip characterized by a reduced evolution of heat loss.

14. A method for producing a semiconductor module comprising semiconductor chips in a plastic housing in separate regions:
   producing semiconductor chips, which are characterized by different thermal sensitivities, for a semiconductor module;
   applying a thermal barrier between adjacent regions which are to be thermally decoupled onto a wiring substrate;
   applying the semiconductor chips onto the common wiring substrate in the thermally decoupled regions; and
   packaging the device components into a common plastic housing composition while embedding the thermal barrier.

15. The method of claim 14, wherein with the application of a thermal barrier between adjacent regions which are to be thermally decoupled, the more thermally sensitive semiconductor chip is completely surrounded by the thermal barrier in the common plastic housing composition.

16. The method of claim 14, wherein the application of a thermal barrier element is effected by an injection-molding operation by means of a thermal barrier element being positioned and fixed in an injection mold prior to the injection-molding.

17. A semiconductor module comprising;
   semiconductor chips in a plastic housing in separate regions;
   wherein the semiconductor chips are embedded in a common plastic housing composition and are arranged on a common wiring substrate in adjacent regions; and
   wherein the wiring substrate has a thermal barrier between the regions, which thermal barrier impedes the heat transfer from one region to an adjacent region, and wherein the thermal barrier, the semiconductor chips and the substrate are surrounded by the common plastic housing composition.

18. The semiconductor module of claim 17, wherein the semiconductor chips are defined by different evolution of heat loss.

19. The semiconductor module of claim 17, wherein the thermal barrier has a material whose specific heat conduction $W_B$ amounts to less than one third of the specific heat conduction $W_K$ of the common plastic housing composition where $W_K \geq 3 W_B$.

20. The semiconductor module of claim 17, wherein the width B of the thermal barrier amounts to at least five times the thickness D of the semiconductor chips where B≧5D.

21. The semiconductor module of claim 17, wherein the thermal barrier thermally shields a region to be protected from an adjacent region on one side.

22. The semiconductor module of claim 17, wherein the thermal barrier surrounds a region to be protected on two sides.

* * * * *